United States Patent
Kavousian et al.

(10) Patent No.: US 9,209,771 B1
(45) Date of Patent: Dec. 8, 2015

(54) EM COUPLING SHIELDING

(71) Applicant: QUALCOMM Incorporated, San Diego, CA (US)

(72) Inventors: Amirpouya Kavousian, San Jose, CA (US); Alireza Khalili, Sunnyvale, CA (US); Mohammad Bagher Vahid Far, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 14 days.

(21) Appl. No.: 14/307,355

(22) Filed: Jun. 17, 2014

(51) Int. Cl.
*H03H 1/00* (2006.01)
*H03H 7/01* (2006.01)
*H04B 3/28* (2006.01)

(52) U.S. Cl.
CPC ........... *H03H 1/0007* (2013.01); *H03H 7/0153* (2013.01); *H04B 3/28* (2013.01)

(58) Field of Classification Search
CPC ................. H03H 1/0007; H03H 2001/0078; H04B 3/28; H04B 3/32
USPC .......................................................... 333/12
See application file for complete search history.

(56) References Cited

U.S. PATENT DOCUMENTS

| | | | |
|---|---|---|---|
| 5,539,283 A | 7/1996 | Piejak et al. | |
| 6,198,362 B1 | 3/2001 | Harada et al. | |
| 6,208,135 B1* | 3/2001 | Shattil | H05K 9/00 324/202 |
| 6,249,006 B1* | 6/2001 | Sakiyama | G01R 1/18 250/505.1 |
| 6,982,378 B2* | 1/2006 | Dickson | H01B 11/1083 174/36 |
| 7,259,625 B2 | 8/2007 | Sanderson | |
| 7,586,381 B2 | 9/2009 | Rohde et al. | |
| 7,679,463 B2 | 3/2010 | Pernia et al. | |
| 8,098,111 B2 | 1/2012 | Chen et al. | |
| 8,169,271 B2* | 5/2012 | Goyal | H03B 19/00 331/117 FE |
| 2004/0021463 A1 | 2/2004 | Miyazawa et al. | |
| 2009/0134954 A1 | 5/2009 | Uzunov et al. | |
| 2010/0090770 A1 | 4/2010 | Matsuo | |
| 2011/0241797 A1 | 10/2011 | Shana'A et al. | |
| 2013/0169374 A1* | 7/2013 | Huang | H03B 5/1228 331/117 FE |

FOREIGN PATENT DOCUMENTS

DE  102006031037 B3  10/2007

OTHER PUBLICATIONS

International Search Report and Written Opinion—PCT/US2015/036069—ISA/EPO—Sep. 15, 2015.

\* cited by examiner

*Primary Examiner* — Dean Takaoka
*Assistant Examiner* — Alan Wong
(74) *Attorney, Agent, or Firm* — Arent Fox LLP

(57) ABSTRACT

A method and an apparatus for canceling EM coupling are provided. The apparatus includes a ring structure at least partially surrounding an EM circuit. A negative transconductance circuit is coupled to ends of the ring structure. The negative transconductance circuit is configured to cancel an EM coupling to the EM circuit at a frequency. The method includes generating a plurality of settings for a negative transconductance circuit and tuning the negative transconductance circuit to one of the plurality of settings for the negative transconductance circuit to cancel an EM coupling to an EM circuit at a frequency.

30 Claims, 13 Drawing Sheets

EM COUPLING SHIELDING

BACKGROUND

1. Field

The present disclosure relates generally to circuits for electromagnetic (EM) coupling shielding, and more particularly, to a ring structure and circuit elements coupled to the ring structure for EM coupling shielding.

2. Background

Wireless communication technologies and devices (e.g., cellular phones, tablets, laptops, etc.) have grown in popularity and use over the past several years. Increasingly, mobile electronic devices have grown in complexity and now commonly include multiple processors (e.g., baseband processor and application processor) and other resources that allow mobile device users to execute complex and power intensive software applications (e.g., music players, web browsers, video streaming applications, etc.). At the same time, the wireless devices are shrinking in size. The increase in complexity coupled with the reduction in size renders the wireless devices more susceptible to EM coupling from an aggressor circuit.

For example, a wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

Due to the reduced dimensions of a wireless device, the various RF circuits for the communication functions described above may be disposed in proximity with each other, and, in some cases, become victim and/or aggressor circuits to each other via EM coupling.

SUMMARY

In an aspect of the disclosure, a method, a computer program product, and an apparatus are provided. The apparatus includes a ring structure at least partially surrounding an EM circuit. A negative transconductance circuit is coupled to ends of the ring structure. The negative transconductance circuit is configured to cancel an EM coupling to the EM circuit at a frequency. The method includes generating a plurality of settings for a negative transconductance circuit and tuning the negative transconductance circuit to one of the plurality of settings for the negative transconductance circuit to cancel an EM coupling to an EM circuit at a frequency.

DETAILED DESCRIPTION

Figure 1:
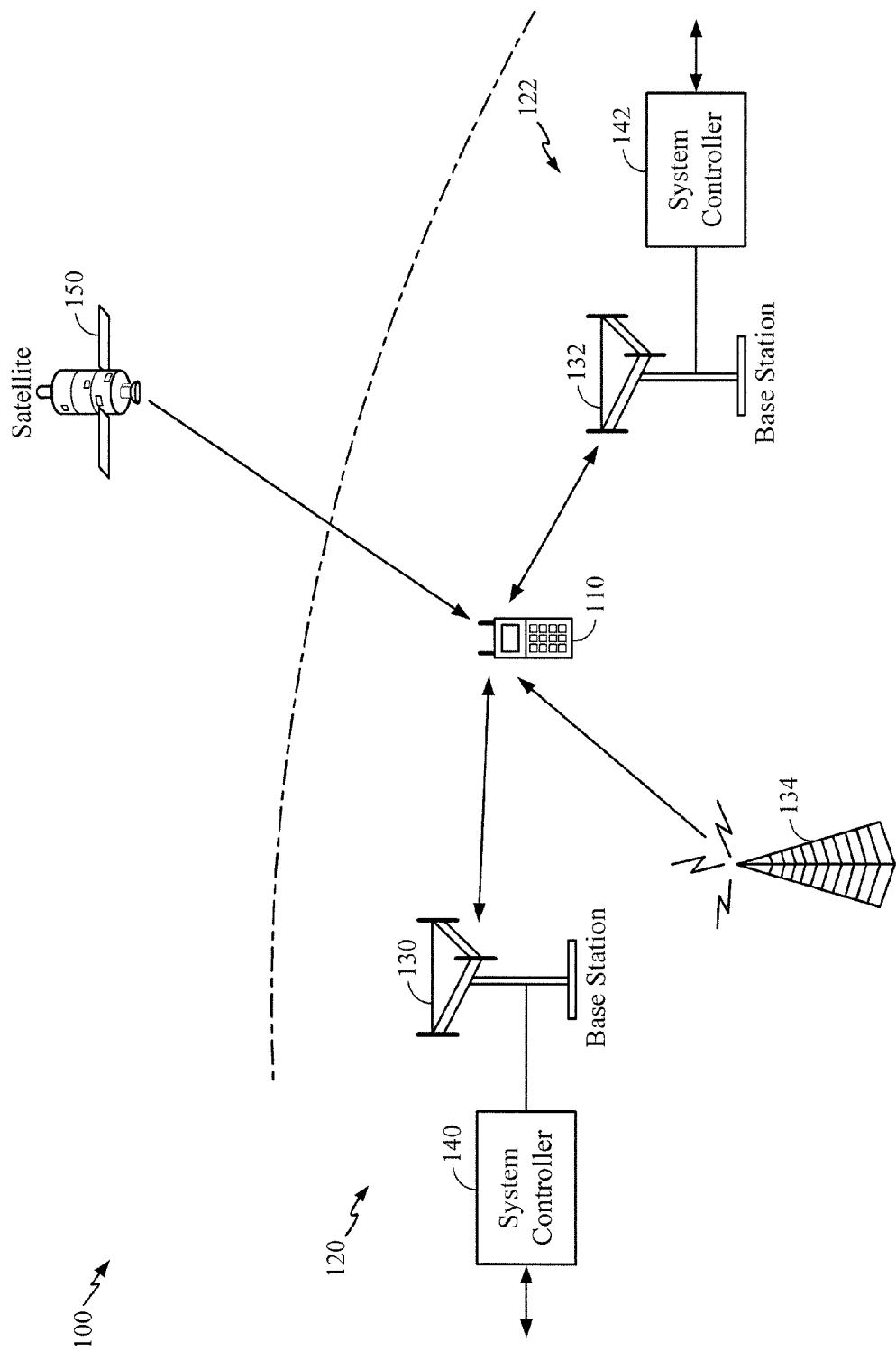
FIG. 1 illustrates a wireless device communicating with different wireless communication systems, in which an exemplary embodiment may be included.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122, in which an exemplary embodiment may be included. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
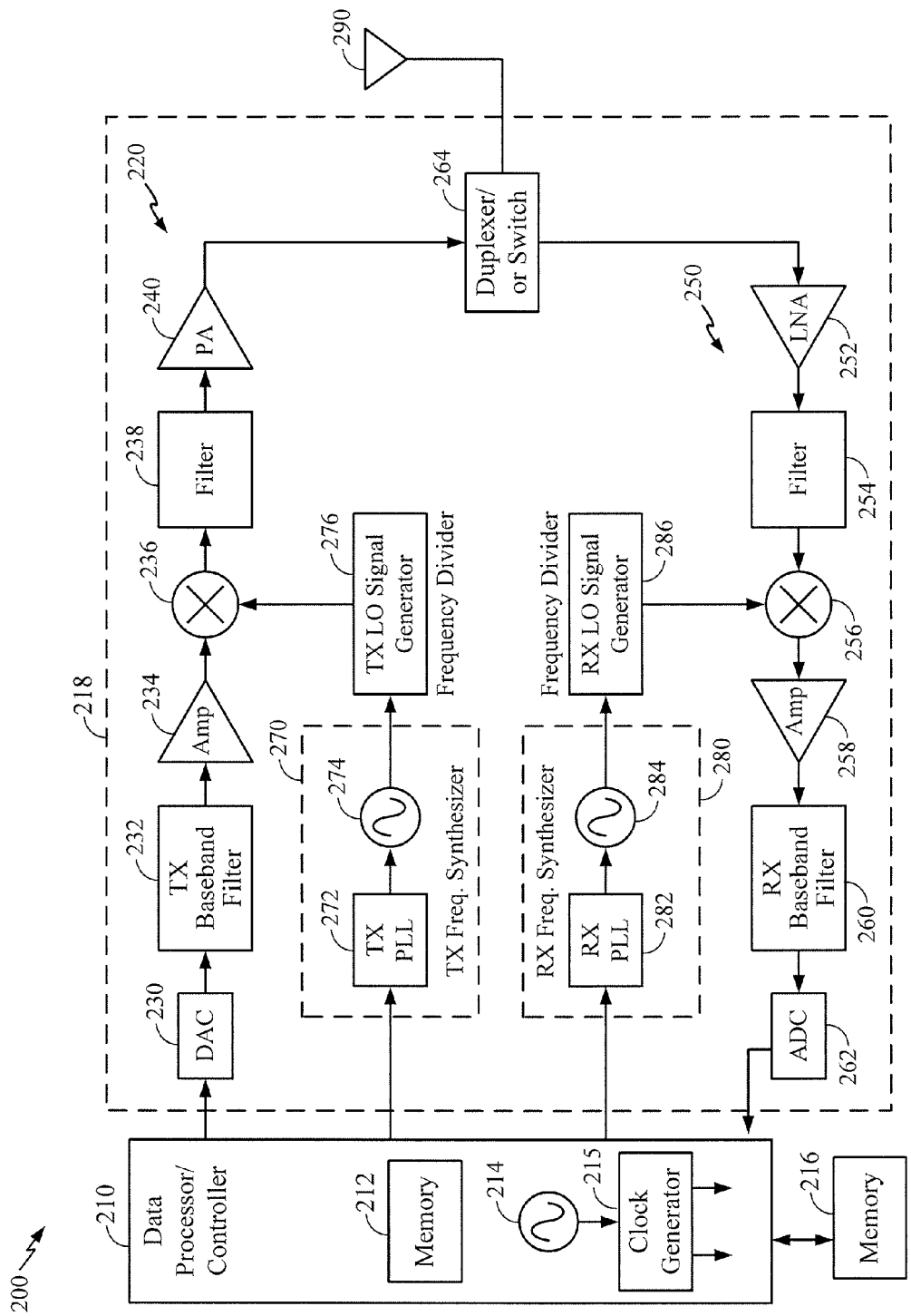
FIG. 2 is a block diagram of a wireless device, in which an exemplary embodiment may be included.

FIG. 2 is a block diagram 200 of an exemplary wireless device, such as the wireless device 110, in which an exemplary embodiment may be included. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO signal generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 215 may receive the VCO signal from the oscillator 214 and may generate clock signals for various modules within the data processor/controller 210. The data processor/controller 210 may be implemented on one or more application specific integrated circuits (ASICs) and/or other ICs.

The RF circuits for the communication functions described with FIG. 1 and FIG. 2 include electromagnetic (EM) circuits for operation. An example of an EM circuit is an inductor. An inductor may be part of the VCO for generate a signal of a desired oscillation frequency. Another exemplary usage of the inductor is in the filter for an LNA (e.g., LNA 252). In these examples, the EM circuits (e.g., the inductor) may become victims of unwanted EM coupling (e.g., magnetic coupling) from an aggressor circuit. The unwanted EM coupling may lead to spurs and frequency pulling in the receiver response. In another example, the unwanted EM coupling may destabilize the transceiver 218. A solution is to provide a shield ring (e.g., conductive structure) to at least partially surround the victim EM circuit.

Figures 3A, 3B:
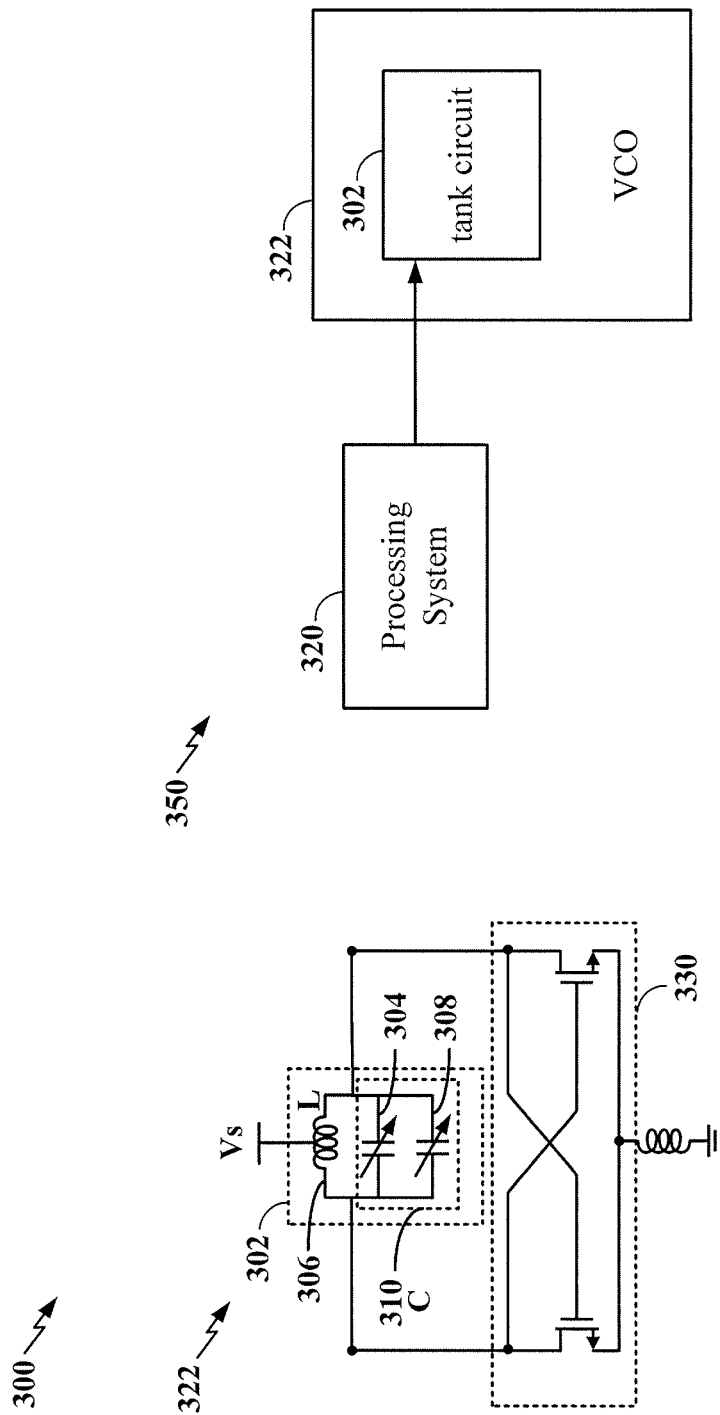
FIG. 3A is a diagram of an example of a VCO.
FIG. 3B is a diagram of a processing system interfacing with a VCO to adjust a tank circuit.

FIG. 3A is a diagram 300 of a VCO. The VCO 322 includes tank circuit 302 and a cross-coupled transistor pair 330. The tank circuit 302 includes an inductor 306 and a capacitor 310, which includes a capacitor bank 304. An example of the EM circuit to be protected may be the inductor 306. The VCO 322 may output a signal oscillating at a frequency based on the inductance value of the inductor 306 and the capacitance of the capacitor 310. Accordingly, the EM coupling to the inductor 306 may alter the oscillating frequency of the VCO 322, and shielding of the EM coupling to the inductor 306 may be needed.

The wireless device 110 may adjust the capacitor bank 304 within the capacitor 310 to tune the capacitance of the capacitor 310. The VCO 322 may correspond to the VCO 274 and/or the VCO 284 in FIG. 2. The capacitor 310 may further include one or more varactors 308 for fine tuning the capacitance. The capacitor bank 304 may be binary-weighted or include a binary-weighted capacitor bank. An n-bit binary-weighted capacitor bank may include capacitors or sets of capacitors with unit capacitances of C, 2C, 4C, ..., $2^n$C. The wireless device 110 adjusts the capacitor 310, coupled with the inductor 306, in order to tune a frequency provided by the VCO.

FIG. 3B is a diagram 350 of a processing system 320 communicating with a VCO 322 to adjust a tank circuit 302 and for calibrate the VCO 322. The processing system 320 is configured to tune the oscillating frequency of the VCO 322 output. For example, the processing system 320 is configured to adjust a capacitor circuit within the tank circuit 302 in the VCO 322 based on a determined relative capacitance change determined from the look-up table in order to tune the output signal to a desired frequency. Moreover, the processing system 320 may calibrate the VCO 322 by, e.g., determining the output frequency of the VCO 322 and a difference, if any, to the expected frequency. Based on such a difference, the processing system 320 may recognize a process skew.

Figure 4A:
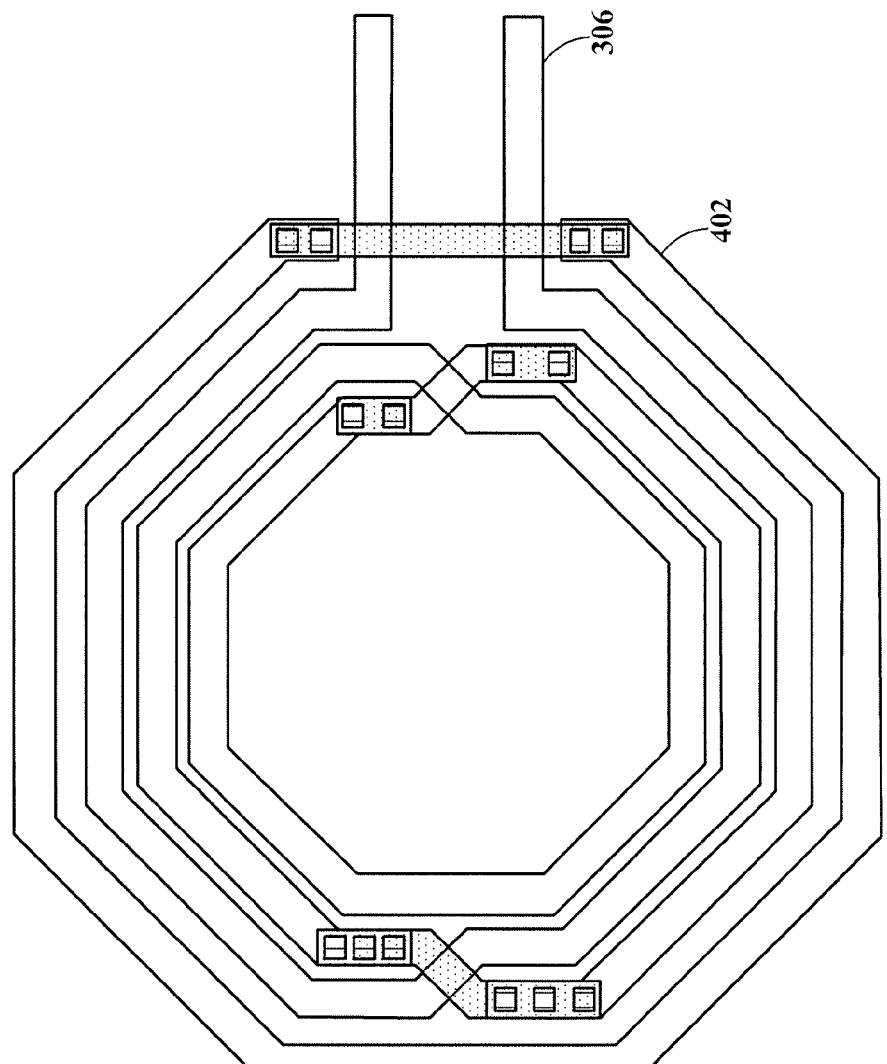
FIG. 4A is a diagram of a protected EM circuit and a ring structure at least partially surrounding the protected EM circuit.

FIG. 4A is a diagram 400 of a protected EM circuit (e.g., inductor 306) and a ring structure (e.g., guard ring 402) at least partially surrounding the protected EM circuit. The inductor 306 is a spiral-type inductor. The guard ring 402 includes a conductive ring structure (in metal 1 and metal 2) that at least partially surrounds the EM circuit or inductor 306. The degree to which the guard ring 402 surrounds the protected EM circuit or inductor 306 is determined by, e.g., the direction and degree of the EM coupling, as would be understood by a person of ordinary skill in the art. The shape of the guard ring 402 needs not be circular, as shown in the figure. In one aspect, the guard ring 402 is floating and functions as an inductor. In another aspect, the guard ring 402 may be connected to a voltage potential such as a voltage supply VDD or ground GND. The guard ring 402 provides certain EM (e.g., magnetic) coupling shielding. In one example, in the illustrated configuration, the EM coupling from an aggressor circuit (not shown) is reduced by 6 dB. However, the effects of the guard ring 402 may include reducing the effective inductance and the quality factor Q of the inductor 306 by, e.g., 10%.

Figure 4B:
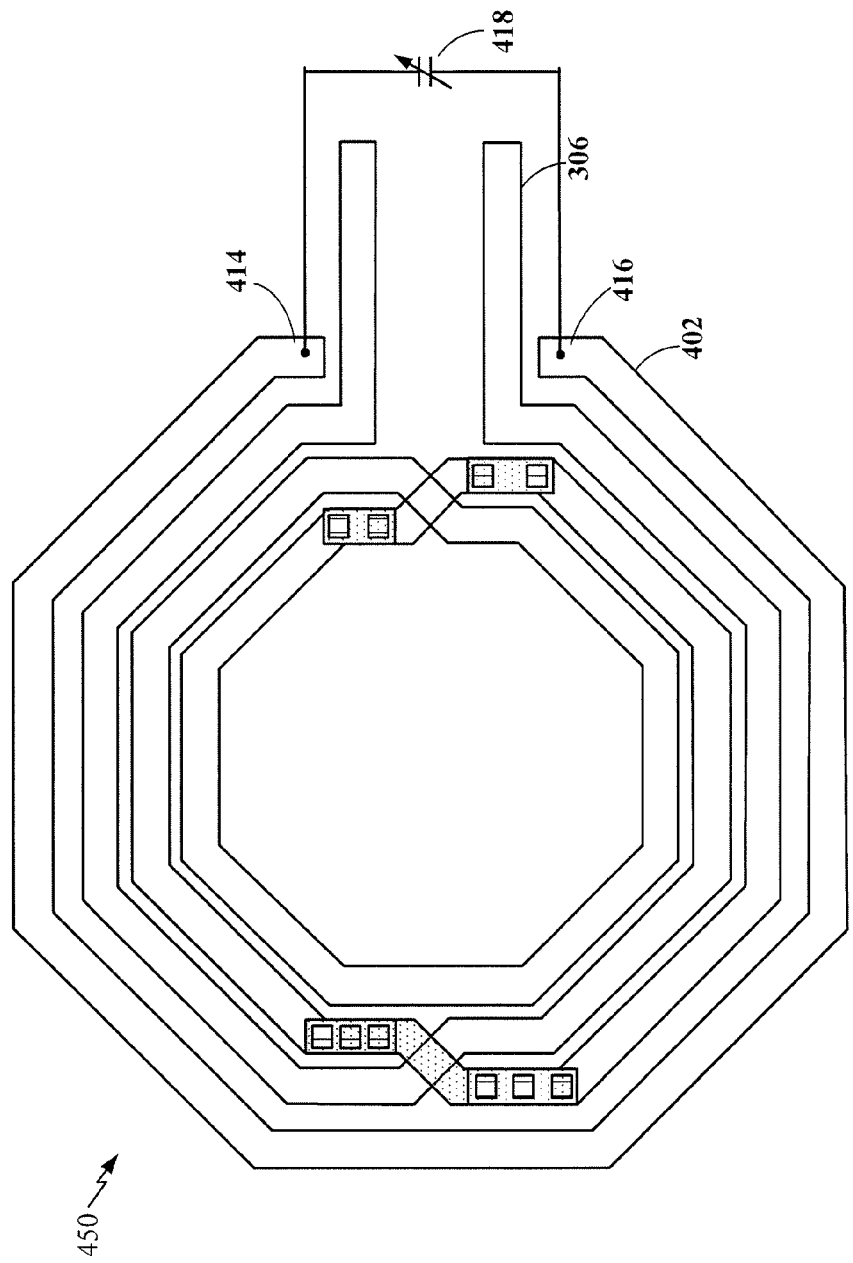
FIG. 4B is another diagram of a protected EM circuit and a ring structure at least partially surrounding the protected EM circuit.

FIG. 4B is another diagram 450 of a protected EM circuit (e.g., inductor 306) and a ring structure (e.g., guard ring 412) at least partially surrounding the protected EM circuit. In this example, the guard ring 412 includes a ring structure (in metal 1 and metal 2) that at least partially surrounds the EM circuit (inductor 306) and includes ends 414 and 416. The degree to which the guard ring 402 surrounds the protected EM circuit or inductor 306 is determined by, e.g., the direction and degree of the EM coupling, as would be understood by a person of ordinary skill in the art. The ends 414 and 416 are coupled to a capacitor 418, which is tunable (e.g. the capacitance of the capacitor 418 may be adjusted to a desired value). In one example, the capacitor 418 may be structurally similar to the capacitor bank 304 described above. The guard ring 412 provides better EM (e.g., magnetic) coupling shielding than the guard ring 402 of FIG. 4A. The resulting effective inductance and the quality factor Q of the protected EM circuit (inductor 306) likewise improve.

Figure 5:
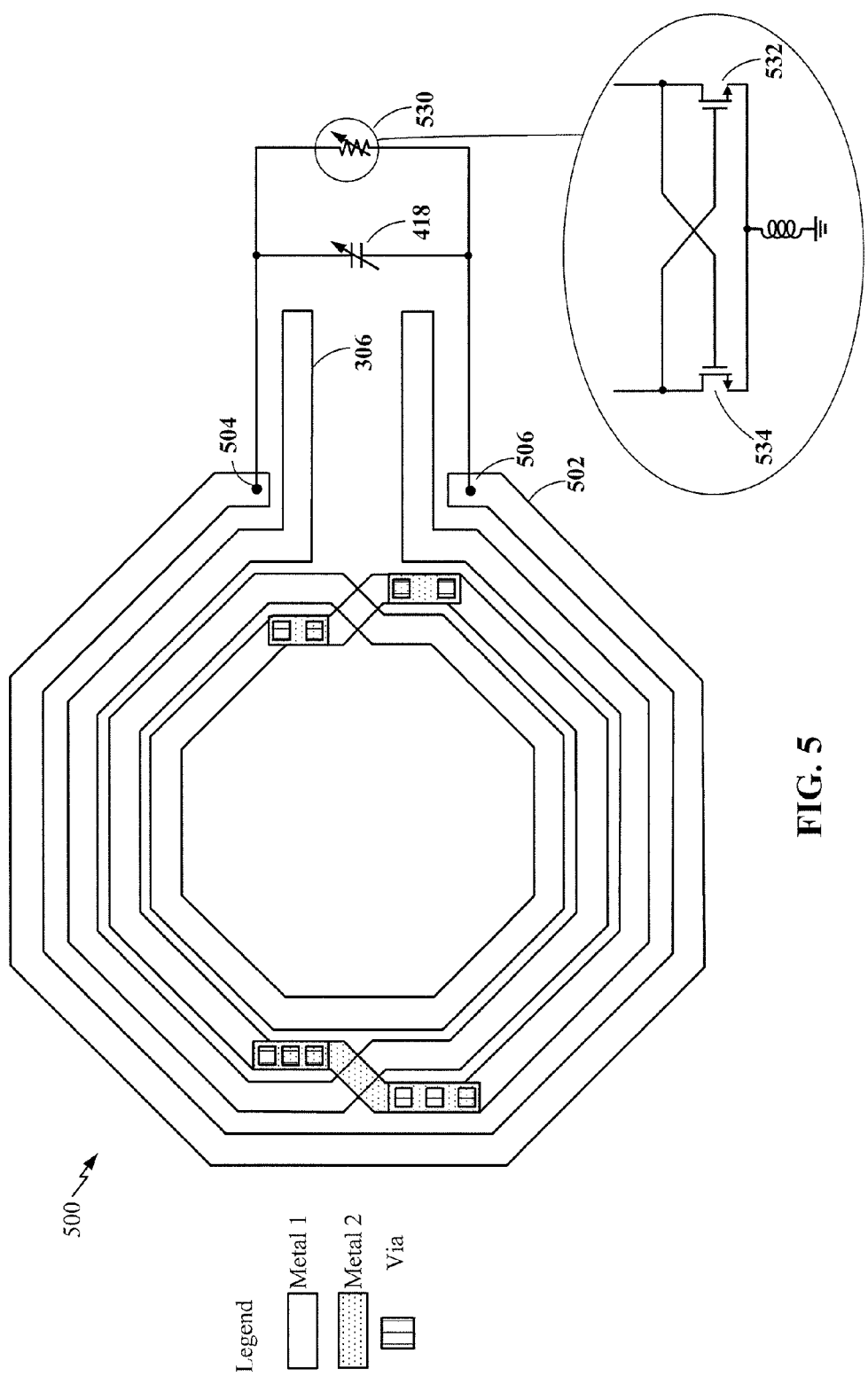
FIG. 5 is a diagram of an exemplary embodiment including a protected EM circuit and a ring structure at least partially surrounding the protected EM circuit.

FIG. 5 is a diagram 500 of an exemplary embodiment including a protected EM circuit (e.g., inductor 306) and a ring structure (e.g., guard ring 502) at least partially surrounding the protected EM circuit. The guard ring 502 includes a ring structure (in metal 1 and metal 2) that at least partially surrounds the EM circuit (inductor 306) and includes ends 504 and 506. The degree to which the guard ring 502 surrounds the protected EM circuit or inductor 306 is determined by, e.g., the direction and degree of the EM coupling, as would be understood by a person of ordinary skill in the art. The ends 504 and 506 are coupled to the capacitor 418 and a negative $g_m$ circuit 530. In one example, the capacitor 418 may be structurally similar to the capacitor bank 304 described above. In one example, the negative $g_m$ circuit 530 includes a cross-coupled transistor pair 532 and 534. The negative $g_m$ circuit 530 may be tunable. For example, the transconductance (or impedance) of the negative $g_m$ circuit 530 may be tuned by adjusting the sizes of the cross-coupled transistor pair 532 and 534. In one example, the negative $g_m$ circuit 530 may be structurally similar to the cross-coupled transistor pair 330 described above.

Figure 6:
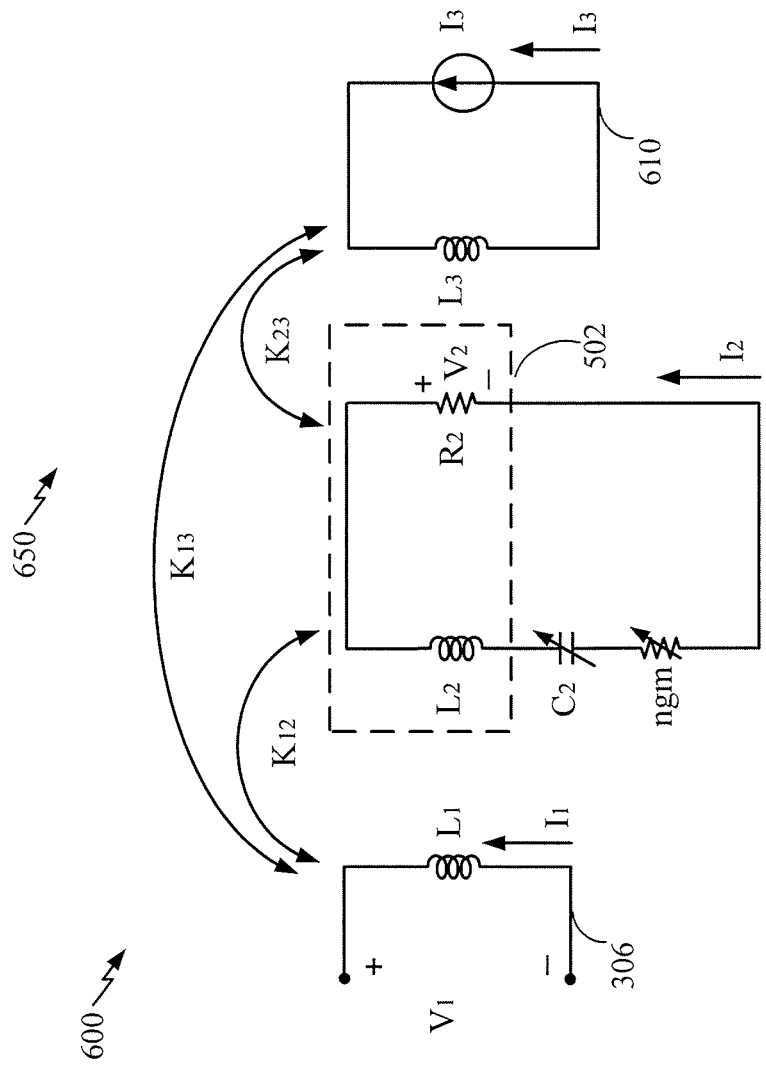
FIG. 6 is a diagram illustrating equivalent circuits of an exemplary embodiment.

FIG. 6 is a diagram 600 illustrating equivalent circuits of an exemplary embodiment. The equivalent circuit of the aggressor circuit 610 includes a power source $I_3$ and an equivalent inductance $L_3$. Examples of the aggressor circuit 610 may include the RF circuits of the transceiver 218, such as the power amplifier 240. The aggressor circuit 610 generates EM coupling (e.g., magnetic coupling) $K_{13}$ to the protected EM circuit or inductor 306 and EM coupling $K_{23}$ to the guard ring 502. The guard ring 502 in turn generates EM coupling $K_{12}$ to the protected EM circuit or inductor 306. The inductor 306 has an inductance $L_1$. Examples of the protected EM circuit may include the inductor 306, upon which the VCO 322 relies for generating a signal of a desired oscillation frequency. The EM couplings $K_{13}$ and $K_{12}$ induce a spurious voltage $V_1$ in the inductor 306, which may impact the oscillation frequency of the VCO 322. In one aspect of the disclosure, the guard ring 502, along with the capacitor 418 and the negative $g_m$ circuit 530, shields the EM couplings $K_{13}$ and $K_{12}$ from the EM circuit (inductor 306) by canceling the voltage $V_1$ in the protect EM circuit or inductor 306. The equivalent circuit of guard ring 502 includes an inductance $L_2$ and a resistance $R_2$, which are the electrical characteristics of the ring structure of the guard ring 502. Voltage $V_2$ is the voltage across the resistance $R_2$. The guard ring 502 is connected to the capacitance $C_2$ of the capacitor 418 and a transconductance ngm of the negative $g_m$ circuit 530. In one aspect of the exemplary embodiment, the negative $g_m$ circuit 530 is tuned to a transconductance ngm which cancels the resistance $R_2$. In another aspect of the exemplary embodiment, the capacitor 418 is tuned to a capacitance $C_2$ which, in combination with the transconductance ngm of the negative $g_m$ circuit 530, cancels the voltage $V_1$ in the protected EM circuit (inductor 306). In one aspect, the settings of the capacitor 418 and/or the settings of the negative $g_m$ circuit 530 are independent of an operation of the protected EM circuit (inductor 306).

The process for canceling the voltage $V_1$ in the protected EM circuit (inductor 306) may be described by the following equations:

$$V_1 = (M_{12}j\omega)I_2 + (M_{13}j\omega)I_3,$$

$$V_2 = (L_2 j\omega)I_2 + (M_{23}j\omega)I_3(1/C_2 j\omega)I_2,$$

where $j\omega$ is the imaginary component of the frequency of, e.g., an operation of the aggressor circuit 610, $M_{12}$ is a coefficient of the EM coupling $K_{12}$, $M_{13}$ is a coefficient of the EM coupling $K_{13}$, $M_{23}$ is a coefficient of the EM coupling $K_{23}$, $I_1$ is the current through the EM circuit (inductor 306)(e.g., induced by the EM couplings), $I_2$ is the current through the guard ring 502 (e.g., induced by the EM couplings), and $I_3$ is the current through the aggressor circuit 610. The voltage $V_2$ across the resistance $R_2$ may also be described as follows:

$$V_2 = -R_2 I_2.$$

Moreover, in one example, the transconductance ngm of the negative $g_m$ circuit 530 is tuned to cancel the resistance $R_2$ (for example, the ngm may be set at $-1/R_2$). The voltage $V_1$ in the protected EM circuit (inductor 306) may be described by:

$$V_1 = -(M_{12}j\omega)\left(\frac{M_{23}j\omega}{L_2 j\omega + 1/C_2 j\omega}\right)I_3 + (M_{13}j\omega)I_3.$$

In one example, the capacitance $C_2$ of the capacitor 418 may be tuned to cancel the voltage $V_1$ in the protected EM circuit (inductor 306). The capacitance $C_2$ of the capacitor 418 may thus be:

$$C_2 = \frac{1}{L_2\omega^2} * \frac{1}{1 - M_{12}M_{23}/M_{13}}.$$

Figure 7:
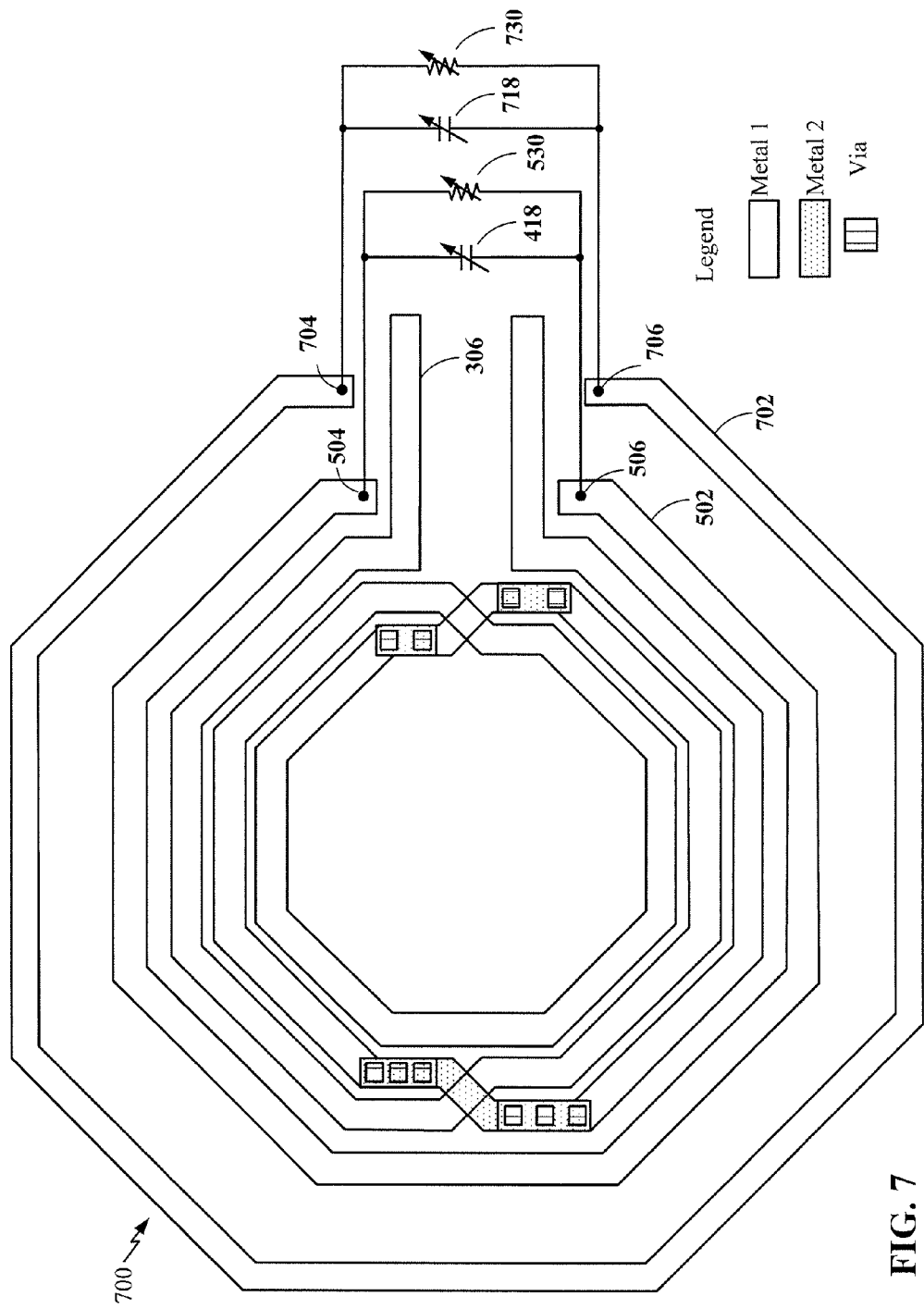
FIG. 7 is a diagram of an exemplary embodiment including a protected EM circuit, a first ring structure, and a second ring structure.

FIG. 7 is a diagram of an exemplary embodiment including a protected EM circuit (e.g., inductor 306), a first ring structure (e.g., guard ring 502), and a second ring structure (e.g., guard ring 702). The guard ring 502 (in metal 1 and metal 2) includes ends 504 and 506 and at least partially surrounds the EM circuit (e.g., inductor 306). The ends 504 and 506 are coupled to the capacitor 418 and the negative $g_m$ circuit 530. The guard ring 502, along with the capacitor 418 and the negative $g_m$ circuit 530, may provide the EM circuit (e.g., inductor 306) with EM coupling (e.g., magnetic coupling) shielding from an aggressor circuit at a first frequency, as described above. For example, the guard ring 502, along with the capacitor 418 and the negative $g_m$ circuit 530, may be configured to cancel a voltage in the EM circuit (inductor 306) generated by an EM coupling from an aggressor circuit operating at the first frequency.

The guard ring 702 (in metal 1 and metal 2) includes ends 704 and 706 and at least partially surrounds the EM circuit (e.g., inductor 306). The degree to which the guard ring 702 surrounds the protected EM circuit or inductor 306 is determined by, e.g., the direction and degree of the EM coupling, as would be understood by a person of ordinary skill in the art. The ends 704 and 706 are coupled to a second capacitor 718 and a second negative $g_m$ circuit 730. The guard ring 702, along with the second capacitor 718 and the second negative $g_m$ circuit 730, may provide the EM circuit (e.g., inductor 306) with EM coupling (e.g., magnetic coupling) shielding from an aggressor circuit at a second frequency, as described above. For example, the guard ring 702, along with the second capacitor 718 and the second negative $g_m$ circuit 730, may be configured to cancel a voltage in the EM circuit (inductor 306) generated by an EM coupling from an aggressor circuit operating at the second frequency. In one aspect, the settings of the second capacitor 718 and/or the settings of the second negative $g_m$ circuit 730 are independent of an operation of the protected EM circuit (inductor 306). In one example, the second negative $g_m$ circuit 730 may be structurally similar to the cross-coupled transistor pair 330 described above. In one example, the capacitor 418 may be structurally similar to the capacitor bank 304 described above.

In one example, the EM coupling of the first frequency and the EM coupling of the second frequency may come from the aggressor circuit (e.g., aggressor circuit 612) operating at different frequencies. In another example, the EM coupling of the first frequency and the EM coupling of the second frequency may come from different aggressor circuits. In one example, the first frequency and the second frequency may be independent of each other. In another example, the first frequency and the second frequency may be harmonics of an operating frequency. For example, the first frequency and the second frequency are harmonics of the LO frequency of the VCO 322.

Figure 8:
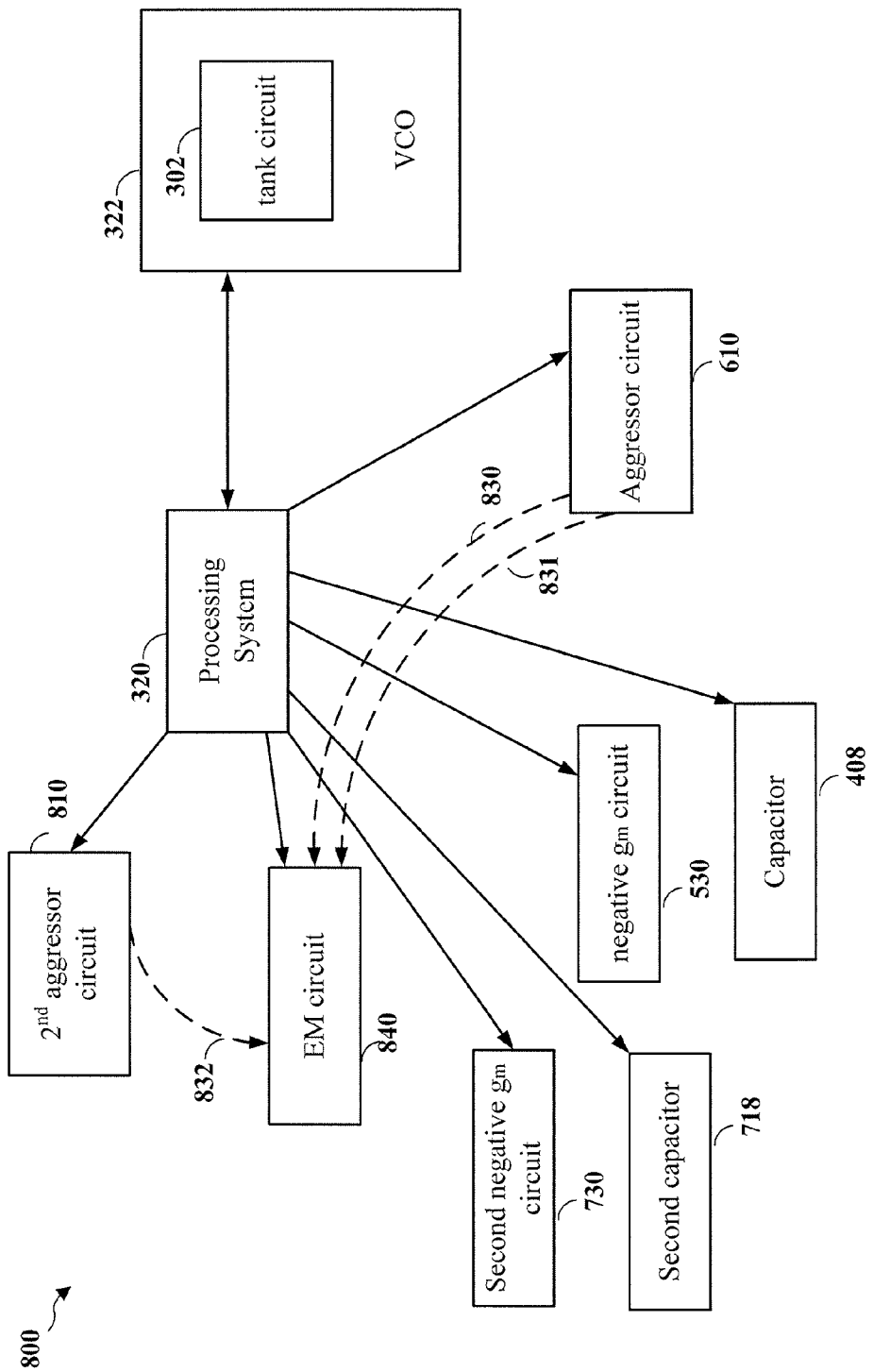
FIG. 8 is a diagram of an exemplary embodiment of generating and tuning settings on a negative $g_m$ circuit and/or a capacitor for canceling an EM coupling.

FIG. 8 is a diagram 800 of an exemplary embodiment of generating and tuning settings on a negative $g_m$ circuit (e.g., 530) and a capacitor (e.g., 408) for canceling an EM coupling. A processing system 320 interfaces with a VCO 322 to adjust a tank circuit 302 and to calibrate the VCO 322, e.g., as described with FIG. 3B. By calibrating VCO 322, the processing system 320 may recognize information relating to process variations based on the calibration (e.g., the oscillating frequency is faster or slower than the process models indicate). For example, the cross-coupled transistor pair 330 of the VCO 322 may be structurally similar to the negative $g_m$ circuit 530 and/or the second negative $g_m$ circuit 730. In one example, the capacitor bank 304 of the VCO 322 may be structurally similar to the capacitor 418 and/or the second capacitor 718. Accordingly, the process variation information obtained from the calibration of the VCO 322 may be applicable to the settings of the negative $g_m$ circuit 530, the second negative $g_m$ circuit 730, the capacitor 418 and/or the second capacitor 718.

In one example, the processing system 320 may be configured to generate settings for the capacitor 408 and the negative $g_m$ circuit 530 for canceling an EM coupling 830. The processing system 320 may supply a test tone to the aggressor circuit 610. The test tone may be, e.g, an RF operation at a frequency. The aggressor circuit 610, in response to the applied test tone, generates the EM coupling 830 to the EM circuit 840. The processing system 320 may tune the settings of the negative $g_m$ circuit 530 and/or the capacitor 408 to cancel the EM coupling 830 (e.g. canceling the voltage) in the EM circuit 840. The processing system 320 may further apply the test tone at various frequencies and generate multiple predetermined settings of the negative $g_m$ circuit 530 and/or the capacitor 408 to cancel the EM coupling 840. Moreover, the settings of the negative $g_m$ circuit 530 and/or the capacitor 408 may be generated or adjusted based on the calibration of the VCO 332. In this fashion, the settings of the negative $g_m$ circuit 530 and/or the capacitor 408 may be generated or adjusted to account for process variations.

In another aspect, The aggressor circuit 610, in response to the applied test tone, generates an EM coupling 831 to the EM circuit 840. The processing system 320 may tune the settings of the second negative $g_m$ circuit 730 and/or the second capacitor 718 to cancel the EM coupling 831 (e.g. canceling the voltage) in the EM circuit 840. The processing system 320 may further apply the test tone at various frequencies and generate multiple predetermined settings of the second negative $g_m$ circuit 730 and/or the second capacitor 718. Moreover, the settings of the second negative $g_m$ circuit 730 and/or the second capacitor 718 may be generated or adjusted based on the calibration of the VCO 332. In this fashion, the settings of the second negative $g_m$ circuit 730 and/or the second capacitor 718 may be generated or adjusted to account for process variations.

In operation, an aggressor circuit 610 may operate at a first frequency. In one example, the processing system 320 may tune the settings of the negative $g_m$ circuit 530 and/or the capacitor 408 (e.g., from the generated multiple settings of the negative $g_m$ circuit 530 and/or the capacitor 408) to cancel the EM coupling 830 at the first frequency. The processing system 320 may tune the settings of the second negative $g_m$ circuit 730 and/or the second capacitor 718 (e.g., from the generated multiple settings of the second negative $g_m$ circuit 730 and/or the second capacitor 718) to cancel the EM coupling 831 at harmonics of the first frequency. In another example, a second aggressor 810 circuit may operate at a second frequency and generates an EM coupling 832 to the EM circuit 840. The processing system 320 may tune the settings of the negative $g_m$ circuit 530 and/or the capacitor 408 (e.g., from the generated multiple settings of the negative $g_m$ circuit 530 and/or the capacitor 408) to cancel the EM coupling 830 at the first frequency. The processing system 320 may further tune the settings of the second negative $g_m$ circuit 730 and/or the second capacitor 718 (e.g., from the generated multiple settings of the second negative $g_m$ circuit 730 and/or the second capacitor 718) to cancel the EM coupling 832 at the second frequency.

Figure 9:
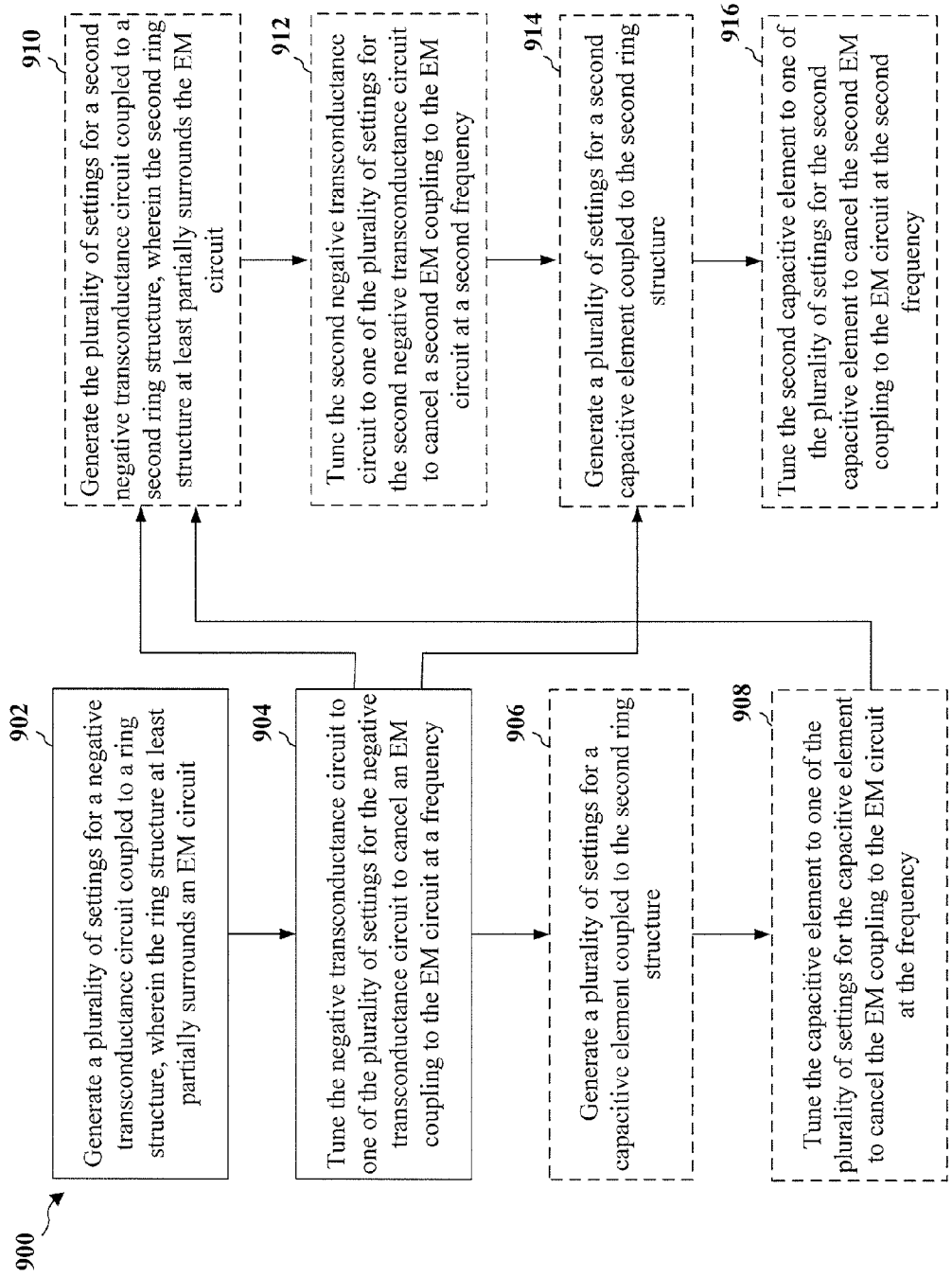
FIG. 9 is a flow chart of a method for generating and tuning settings on a negative $g_m$ circuit and a capacitor for canceling an EM coupling.

FIG. 9 is a flow chart 900 of a method for generating and tuning settings on a negative $g_m$ circuit (e.g., 530) and a capacitor (e.g., 408) for canceling an EM coupling. The steps shown in dotted lines may be optional. The method may be performed by an apparatus, e.g., the processing system 320. In step 902, the apparatus generates a plurality of settings for a negative transconductance circuit coupled to a ring structure. The ring structure at least partially surrounds an EM circuit. In step 904, the apparatus tunes the negative transconductance circuit to one of the plurality of settings for the negative transconductance circuit to cancel an EM coupling to the EM circuit at a frequency. In step 906, the apparatus generates a plurality of settings for a capacitive element coupled to the second ring structure. In step 908, the apparatus tunes the capacitive element to one of the plurality of settings for the capacitive element to cancel the EM coupling to the EM circuit at the frequency. In step 910, the apparatus generates the plurality of settings for a second negative transconductance circuit coupled to a second ring structure, wherein the second ring structure at least partially surrounds the EM circuit. In step 912, the apparatus tunes the second negative transconductance circuit to one of the plurality of settings for the second negative transconductance circuit to cancel a second EM coupling to the EM circuit at a second frequency. In step 914, the apparatus generates a plurality of settings for a second capacitive element coupled to the second ring structure. In step 916, the apparatus tunes the second capacitive element to one of the plurality of settings for the second capacitive element to cancel the second EM coupling to the EM circuit at the second frequency.

Examples of the steps are described in association with FIGS. 5-8 above. For example, referring to FIGS. 5-8, the processing system 320 may generate settings for the capacitor 408 and/or the negative $g_m$ circuit 530 for canceling an EM coupling 830. The capacitor 408 and/or the negative $g_m$ circuit 530 are coupled to ends of a ring structure (e.g., guard ring 502), as shown in FIG. 7. The ring structure (e.g., guard ring 502) at least partially surrounds the protected EM circuit 840 (e.g., the inductor 306). The processing system 320 may supply a test tone to the aggressor circuit 610. The test tone may be, e.g., an RF operation at a frequency. The aggressor circuit 610, in response to the applied test tone, generates the EM coupling 830 to the EM circuit 840. The processing system 320 may tune the settings of the negative $g_m$ circuit 530 and/or the capacitor 408 to cancel the EM coupling 830 (e.g. canceling the voltage) in the EM circuit 840. The processing system 320 may further apply the test tone at various frequencies and generate multiple predetermined settings of the negative $g_m$ circuit 530 and/or the capacitor 408 to cancel the EM coupling 840.

In another aspect, the aggressor circuit 610, in response to the applied test tone, generates an EM coupling 831 to the EM circuit 840. The processing system 320 may tune the settings of the second negative $g_m$ circuit 730 and/or the second capacitor 718 to cancel the EM coupling 831 (e.g. canceling the voltage) in the EM circuit 840. The processing system 320 may further apply the test tone at various frequencies and generate multiple predetermined settings of the second negative $g_m$ circuit 730 and/or the second capacitor 718.

Examples of the tuning process may include one described with FIG. 6. The equivalent circuit of the aggressor circuit 610 includes a power source $I_3$ and an equivalent inductance $L_3$. Examples of the aggressor circuit 610 may include the RF circuits of the transceiver 218, such as the power amplifier 240. The aggressor circuit 610 generates EM coupling (e.g., magnetic coupling) $K_{13}$ to the protected EM circuit (inductor 306) and EM coupling $K_{23}$ to the guarding 502. The guard ring 502 in turn generates EM coupling $K_{12}$ to the protected EM circuit (inductor 306). The protected EM circuit (inductor 306) has an inductance $L_1$. Examples of the protected EM circuit may include the inductor 306, upon which the VCO 322 relies for generating a signal of a desired oscillation frequency. The EM couplings $K_{13}$ and $K_{12}$ induced a spurious voltage $V_1$ in the protected EM circuit (inductor 306), which may impact the oscillation frequency of the VCO 322. In one aspect of the disclosure, the guard ring 502, along with the capacitor 418 and the negative $g_m$ circuit 530, shields the EM couplings $K_{13}$ and $K_{12}$ from the EM circuit (inductor 306) by canceling the voltage $V_1$ in the EM circuit (inductor 306). The equivalent circuit of guard ring 502 includes an inductance $L_2$ and a resistance $R_2$, which are the electrical characteristics of the ring structure of the guard ring 502. Voltage $V_2$ is the voltage across the resistance $R_2$. The guard ring 502 is connected to the capacitance $C_2$ of the capacitor 418 and a transconductance ngm of the negative $g_m$ circuit 530. In one aspect of the exemplary embodiment, the negative $g_m$ circuit 530 is tuned to an transconductance ngm which cancels the resistance $R_2$. In another aspect of the exemplary embodiment, the capacitor 418 is tuned to a capacitance $C_2$ which, in combination with the transconductance ngm of the negative $g_m$ circuit 530, cancels the voltage $V_1$ in the protected EM circuit (inductor 306).

The process for canceling the voltage $V_1$ in the protected EM circuit (inductor 306) may be described by the following equations:

$$V_1=(M_{12}j\omega)I_2+(M_{13}j\omega)I_3,$$

$$V_2=(L_2j\omega)I_2+(M_{23}j\omega)I_3(1/C_2j\omega)I_2,$$

where $j\omega$ is the imaginary component of the frequency of, e.g., an operation of the aggressor circuit 610, $M_{12}$ is a coefficient of the EM coupling $K_{12}$, $M_{13}$ is a coefficient of the EM coupling $K_{13}$, $M_{23}$ is a coefficient of the EM coupling $K_{23}$, $I_1$ is the current through the EM circuit (e.g., induced by the EM couplings), $I_2$ is the current through the guard ring 502 (e.g., induced by the EM couplings), $I_3$ is the current through the aggressor circuit 610. The voltage $V_2$ across the resistance $R_2$ may also be described as follows:

$$V_2 = -R_2 I_2.$$

Moreover, in one example, the transconductance ngm of the negative $g_m$ circuit 530 is tuned to cancel the resistance $R_2$ (for example, the ngm is set at $-1/R_2$). The voltage $V_1$ in the protected EM circuit (inductor 306) may be described by:

$$V_1 = -(M_{12} j\omega)\left(\frac{M_{23} j\omega}{L_2 j\omega + 1/C_2 j\omega}\right) I_3 + (M_{13} j\omega) I_3.$$

In one example, the capacitance $C_2$ of the capacitor 418 may be tuned to cancel the voltage $V_1$ in the protected EM circuit (inductor 306). The capacitance $C_2$ of the capacitor 418 may thus be:

$$C_2 = \frac{1}{L_2 \omega^2} * \frac{1}{1 - M_{12} M_{23}/M_{13}}.$$

In operation, an aggressor circuit 610 may operate at a first frequency. In one example, the processing system 320 may tune the settings of the negative $g_m$ circuit 530 and/or the capacitor 408 (e.g., from the generated multiple settings of the negative $g_m$ circuit 530 and/or the capacitor 408) to cancel an EM coupling 830 at the first frequency. The processing system 320 may tune the settings of the second negative $g_m$ circuit 730 and/or the second capacitor 718 (e.g., from the generated multiple settings of the second negative $g_m$ circuit 730 and/or the second capacitor 718) to cancel an EM coupling 831 at harmonics of the first frequency. In another example, a second aggressor 810 circuit may operate at a second frequency and generates an EM coupling 832 to the EM circuit 840. The processing system 320 may tune the settings of the negative $g_m$ circuit 530 and/or the capacitor 408 (e.g., from the generated multiple settings of the negative $g_m$ circuit 530 and/or the capacitor 408) to cancel the EM coupling 830 at the first frequency. The processing system 320 may further tune the settings of the second negative $g_m$ circuit 730 and/or the second capacitor 718 (e.g., from the generated multiple settings of the second negative $g_m$ circuit 730 and/or the second capacitor 718) to cancel the EM coupling 832 at the second frequency.

Figure 10:
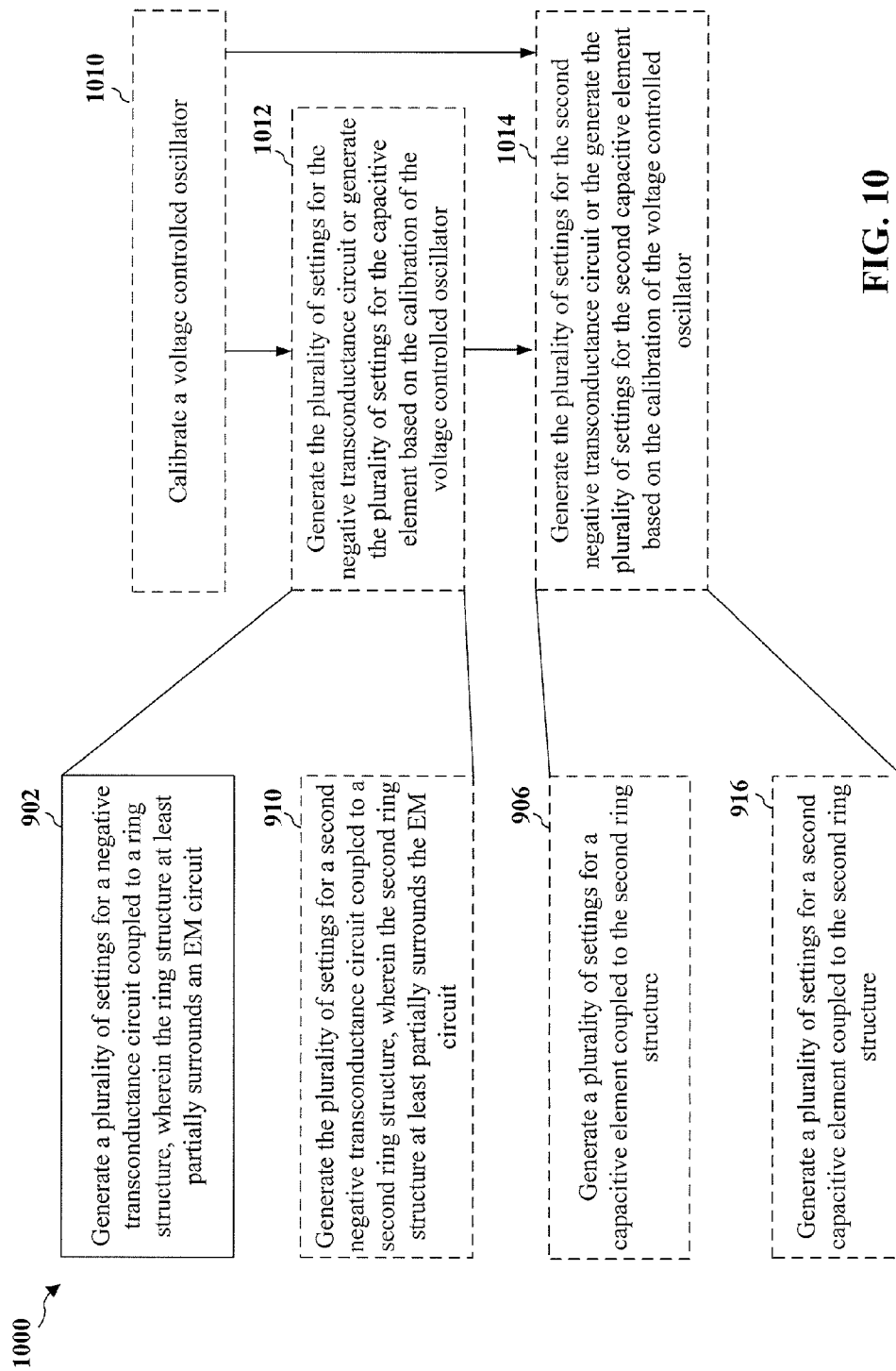
FIG. 10 is a flow chart of another method for generating and tuning settings on a negative $g_m$ circuit and a capacitor for canceling an EM coupling.

FIG. 10 is a flow chart 1000 of another method for generating and tuning settings on a negative $g_m$ circuit (e.g., 530) and a capacitor (e.g., 408) for canceling an EM coupling. The steps shown in dotted lines may be optional. The method may be performed by an apparatus, e.g., the processing system 320. In step 902, the apparatus generates a plurality of settings for a negative transconductance circuit coupled to a ring structure. The ring structure at least partially surrounds an EM circuit. In step 906, the apparatus generates a plurality of settings for a capacitive element coupled to the second ring structure. In step 910, the apparatus generates the plurality of settings for a second negative transconductance circuit coupled to a second ring structure, wherein the second ring structure at least partially surrounds the EM circuit. In step 916, the apparatus tunes the second capacitive element to one of the plurality of settings for the second capacitive element to cancel the second EM coupling to the EM circuit at the second frequency. At 1010, the apparatus calibrates a voltage controlled oscillator. At 1012, the apparatus generates the plurality of settings for the negative transconductance circuit or generate the plurality of settings for the capacitive element based on the calibration of the voltage controlled oscillator.

For example, referring to FIGS. 5-8, the processing system 320 may interface with a VCO 322 to adjust a tank circuit 302 and to calibrate the VCO 322, e.g., as described with FIG. 3B. By calibrating VCO 322, the processing system 320 may recognize information relating to process variations based on the calibration (e.g., the oscillating frequency is faster or slower than the process models indicate). The settings of the negative $g_m$ circuit 530 and/or the capacitor 408 may be generated or adjusted based on the calibration of the VCO 332. In this fashion, the settings of the negative $g_m$ circuit 530 and/or the capacitor 408 may be generated or adjusted to account for process variations. Moreover, the settings of the second negative $g_m$ circuit 730 and/or the second capacitor 718 may be generated or adjusted based on the calibration of the VCO 332. In this fashion, the settings of the second negative $g_m$ circuit 730 and/or the second capacitor 718 may be generated or adjusted to account for process variations.

Figure 11:
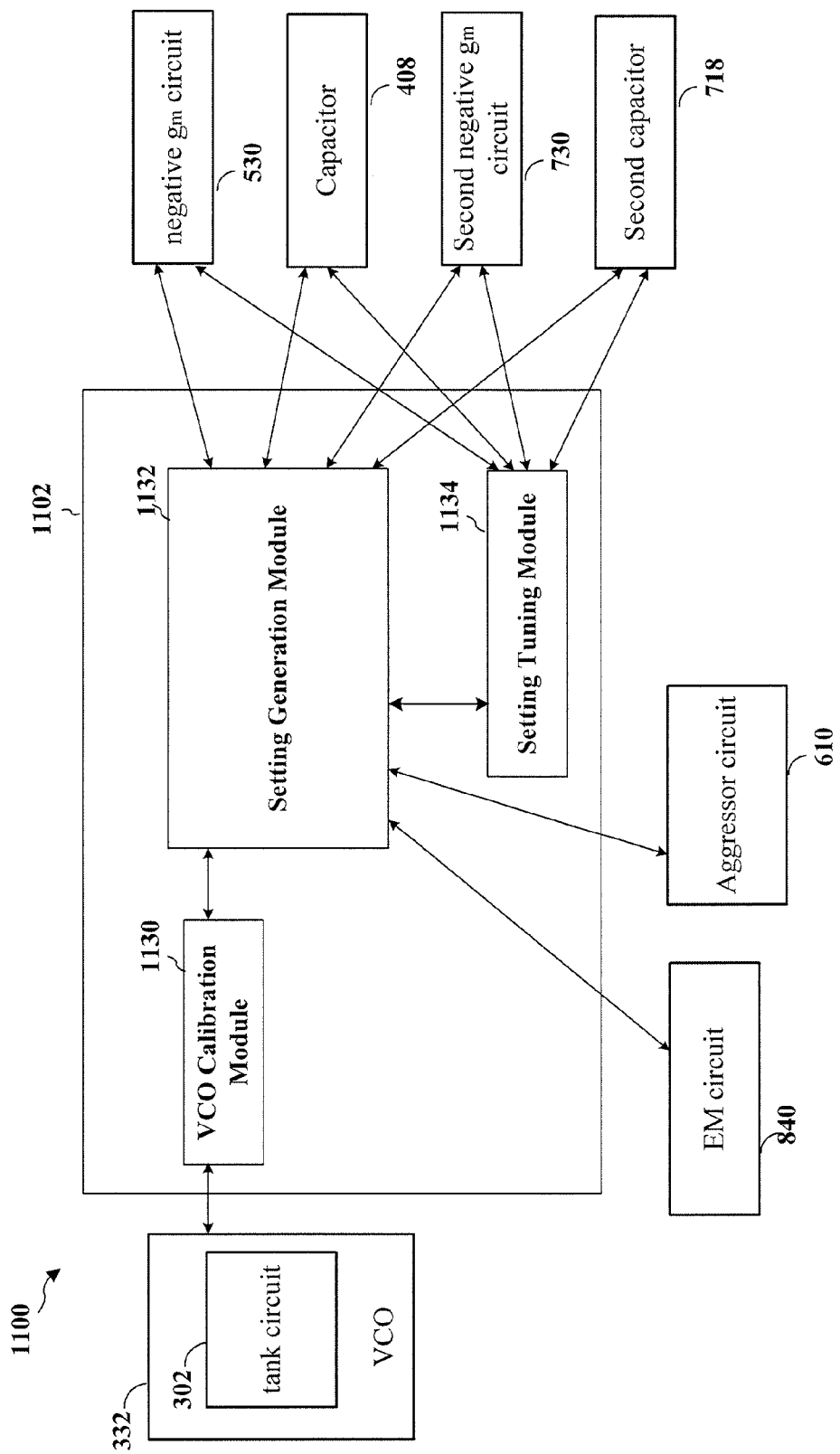
FIG. 11 is a conceptual data flow diagram 1100 illustrating the data flow between different modules/means/components in an exemplary apparatus

FIG. 11 is a conceptual data flow diagram 1100 illustrating the data flow between different modules/means/components in an exemplary apparatus 1102'. The apparatus 1102' may be a processing system 320. The apparatus includes a VCO calibration module 1130 that is configured to calibrate the VCO 322. In one example, the apparatus calibrates the frequency of the VCO and recognizes the process variations. The apparatus further includes a setting generation module 1132. The setting generation module 1132 may be configured to generated multiple predetermined settings for the negative $g_m$ circuit 530 and/or the capacitor 408 for canceling EM couplings. The setting generation module 1132 may further be configured to generated multiple predetermined settings for the second negative $g_m$ circuit 730 and/or the second capacitor 718 for canceling EM couplings. The settings are generated by providing a test tone to an aggressor circuit 610 and determining the effects of the settings at the protected EM circuit 840. The apparatus includes a setting tuning module that is configured to tune the negative $g_m$ circuit 530 and/or the capacitor 408 to a setting or settings for canceling an EM coupling of a first frequency. The setting tuning module is further configured to tune the second negative $g_m$ circuit 730 and/or the second capacitor 718 to a setting or settings for canceling an EM coupling of a second frequency.

Figure 12:
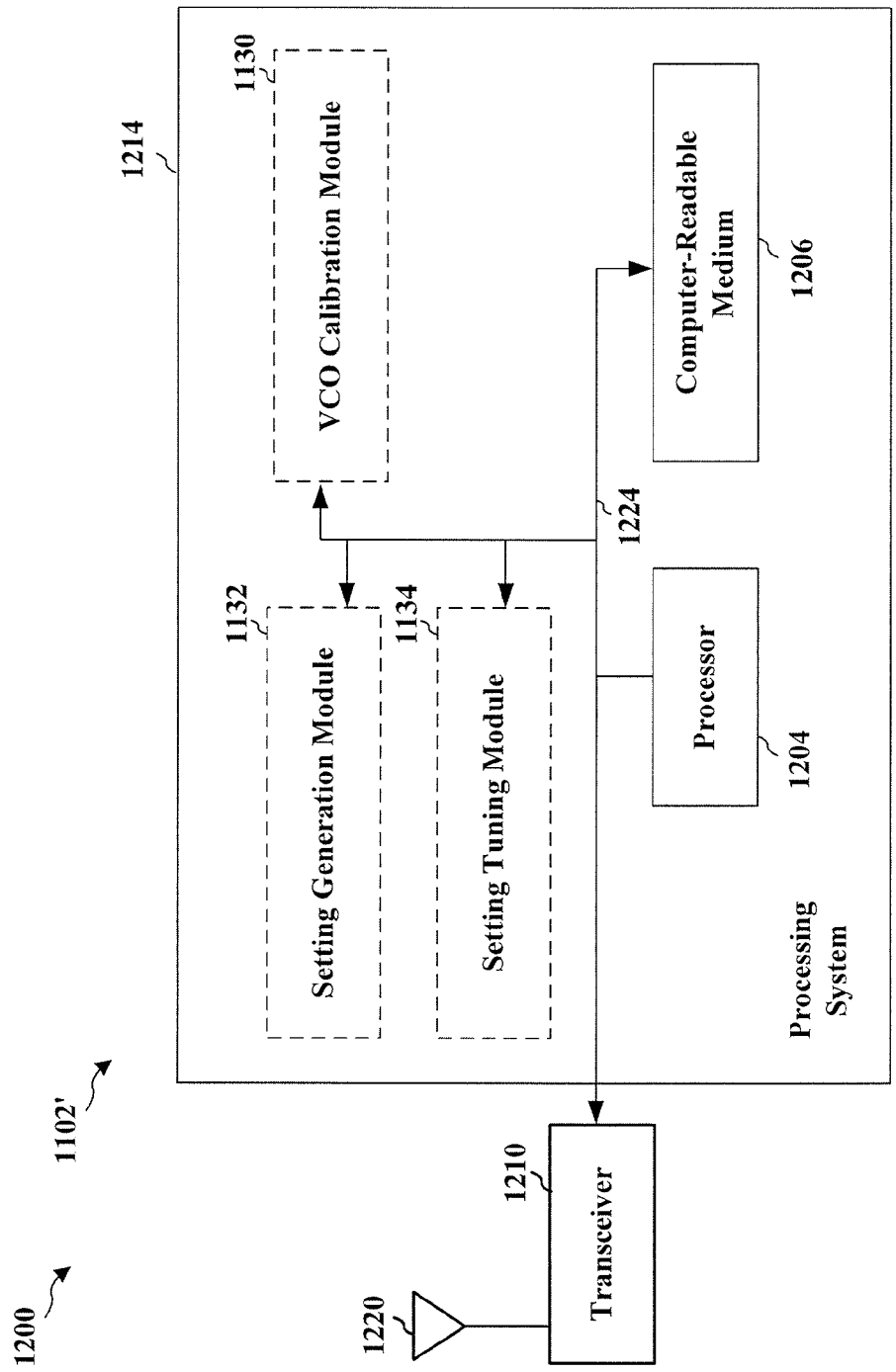
FIG. 12 is a diagram illustrating an example of a hardware implementation for an apparatus employing a processing system.

FIG. 12 is a diagram 1200 illustrating an example of a hardware implementation for an apparatus 1102 employing a processing system 1214. The processing system 1214 may be implemented with a bus architecture, represented generally by the bus 1224. The bus 1224 may include any number of interconnecting buses and bridges depending on the specific application of the processing system 1214 and the overall design constraints. The bus 1224 links together various circuits including one or more processors and/or hardware modules, represented by the processor 1204, the modules 1130, 1132, 1134, and the computer-readable medium 1206. The bus 1224 may also link various other circuits such as timing sources, peripherals, voltage regulators, and power management circuits, which are well known in the art, and therefore, will not be described any further.

The processing system 1214 may be coupled to a transceiver 1210. The transceiver 1210 is coupled to one or more antennas 1220. The transceiver 1210 provides a means for communicating with various other apparatus over a transmission medium. The transceiver 1210 receives a signal from the one or more antennas 1220, extracts information from the received signal, and provides the extracted information to the processing system 1214. In addition, the transceiver 1210 receives information from the processing system 1214, and based on the received information, generates a signal to be applied to the one or more antennas 1220. The processing system 1214 includes a processor 1204 coupled to a computer-readable medium 1206. The processor 1204 is responsible for general processing, including the execution of software stored on the computer-readable medium 1206. The software, when executed by the processor 1204, causes the processing system 1214 to perform the various functions described supra for any particular apparatus. The computer-readable medium 1206 may also be used for storing data that is manipulated by the processor 1204 when executing software. The processing system further includes at least one of the modules 1130, 1132, and 1134. The modules may be software modules running in the processor 1204, resident/stored in the computer readable medium 1206, one or more hardware modules coupled to the processor 1204, or some combination thereof.

In one configuration, the apparatus 1102/1102' includes means for generating a plurality of settings for a negative transconductance circuit coupled to a ring structure. The ring structure at least partially surrounds an EM circuit. The apparatus further includes means for tuning the negative transconductance circuit to one of the plurality of settings for the negative transconductance circuit to cancel an EM coupling to the EM circuit at a frequency. The apparatus further include means for generating a plurality of settings for a capacitive element coupled to the ring structure and means for tuning the capacitive element to one of the plurality of settings for the capacitive element to cancel the EM coupling to the EM circuit at the frequency. The apparatus further includes means for generating the plurality of settings for a second negative transconductance circuit coupled to a second ring structure. The second ring structure at least partially surrounds the EM circuit. The apparatus further includes means for tuning the second negative transconductance circuit to one of the plurality of settings for the second negative transconductance circuit to cancel a second EM coupling to the EM circuit at a second frequency. The apparatus further includes means for generating a plurality of settings for a second capacitive element coupled to the second ring structure and means for tuning the second capacitive element to one of the plurality of settings for the second capacitive element to cancel the second EM coupling to the EM circuit at the second frequency. The apparatus further includes means for calibrating a voltage controlled oscillator. The generating the plurality of settings for the negative transconductance circuit or the generating the plurality of settings for the capacitive element is based on a result of calibrating the voltage controlled oscillator. The generating the plurality of settings for the second negative transconductance circuit or the generating the plurality of settings for the second capacitive element is based on a result of the calibrating the voltage controlled oscillator. The aforementioned means may be one or more of the aforementioned modules of the apparatus 1102, the processing system 1214 of the apparatus 1102', and/or the processing system 320 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A apparatus for canceling electromagnetic (EM) coupling, comprising:
    a ring structure at least partially surrounding an EM circuit;
    a negative transconductance circuit coupled to ends of the ring structure,
    wherein the negative transconductance circuit is configured to cancel an EM coupling to the EM circuit at a frequency.

2. The apparatus of claim 1, further comprising a capacitive element coupled to the ends of the ring structure, the capacitive element is configured to cancel the EM coupling to the EM circuit at the frequency.

3. The apparatus of claim 2, wherein the capacitive element comprises a capacitor bank.

4. The apparatus of claim 2, wherein the capacitive element is configured to be tunable in a plurality of predetermined settings for the capacitive element.

5. The apparatus of claim 1, wherein the negative transconductance circuit is configured to cancel the EM coupling to the EM circuit at the frequency be canceling a resistance of the ring structure.

6. The apparatus of claim 1, wherein the negative transconductance circuit comprises a cross-coupled transistor pair.

7. The apparatus of claim 1, wherein the negative transconductance circuit is configured to be tunable in a plurality of predetermined settings for the negative transconductance circuit.

8. The apparatus of claim 1, further comprising:
    a second ring structure at least partially surrounding the EM circuit;
    a second negative transconductance circuit coupled to ends of the second ring structure, the second negative transconductance circuit is configured to cancel an EM coupling to the EM circuit at a second frequency.

9. A method for operating an apparatus for canceling electro-magnetic (EM) coupling, comprising:
    generating a plurality of settings for a negative transconductance circuit coupled to a ring structure, wherein the ring structure at least partially surrounds an EM circuit;
    tuning the negative transconductance circuit to one of the plurality of settings for the negative transconductance circuit to cancel an EM coupling to the EM circuit at a frequency.

10. The method of claim 9, further comprising:
generating a plurality of settings for a capacitive element coupled to the ring structure;
tuning the capacitive element to one of the plurality of settings for the capacitive element to cancel the EM coupling to the EM circuit at the frequency.

11. The method of claim 10, further comprising
generating the plurality of settings for a second negative transconductance circuit coupled to a second ring structure, wherein the second ring structure at least partially surrounds the EM circuit;
tuning the second negative transconductance circuit to one of the plurality of settings for the second negative transconductance circuit to cancel a second EM coupling to the EM circuit at a second frequency.

12. The method of claim 11, further comprising:
generating a plurality of settings for a second capacitive element coupled to the second ring structure;
tuning the second capacitive element to one of the plurality of settings for the second capacitive element to cancel the second EM coupling to the EM circuit at the second frequency.

13. The method of claim 12, further comprising calibrating a voltage controlled oscillator, wherein the generating the plurality of settings for the negative transconductance circuit or the generating the plurality of settings for the capacitive element is based on the calibration of the voltage controlled oscillator.

14. The method of claim 13, wherein the calibrating the voltage controlled oscillator comprises changing a capacitance of a capacitor in the voltage controlled oscillator for varying an output signal frequency.

15. The method of claim 12, further comprising calibrating a voltage controlled oscillator, wherein the generating the plurality of settings for the second negative transconductance circuit or the generating the plurality of settings for the second capacitive element is based on the calibration of the voltage controlled oscillator.

16. The method of claim 15, wherein the calibrating the voltage controlled oscillator comprises changing a capacitance of a capacitor in the voltage controlled oscillator for varying an output signal frequency.

17. An apparatus for canceling electro-magnetic (EM) coupling, comprising:
a memory; and
at least one processor coupled to the memory and configured to:
generate a plurality of settings for a negative transconductance circuit coupled to a ring structure, wherein the ring structure at least partially surrounds an EM circuit;
tune the negative transconductance circuit to one of the plurality of settings for the negative transconductance circuit to cancel an EM coupling to the EM circuit at a frequency.

18. The apparatus of claim 17, wherein the at least one processor is configured to:
generate a plurality of settings for a capacitive element coupled to the ring structure;
tune the capacitive element to one of the plurality of settings for the capacitive element to cancel the EM coupling to the EM circuit at the frequency.

19. The apparatus of claim 18, wherein the at least one processor is configured to:
generate the plurality of settings for a second negative transconductance circuit coupled to a second ring structure, wherein the second ring structure at least partially surrounds the EM circuit; and
tune the second negative transconductance circuit to one of the plurality of settings for the second negative transconductance circuit to cancel a second EM coupling to the EM circuit at a second frequency.

20. The apparatus of claim 19, wherein the at least one processor is configured to:
generate a plurality of settings for a second capacitive element coupled to the second ring structure;
tune the second capacitive element to one of the plurality of settings for the second capacitive element to cancel the second EM coupling to the EM circuit at the second frequency.

21. The apparatus of claim 20, wherein the at least one processor is configured to:
calibrate a voltage controlled oscillator; and
generate the plurality of settings for the negative transconductance circuit or generate the plurality of settings for the capacitive element based on the calibration of the voltage controlled oscillator.

22. The apparatus of claim 21, wherein the at least one processor is configured to calibrate the voltage controlled oscillator by changing a capacitance of a capacitor in the voltage controlled oscillator for varying an output signal frequency.

23. The apparatus of claim 20, wherein the at least one processor is configured to:
calibrate a voltage controlled oscillator; and
generate the plurality of settings for the second negative transconductance circuit or the generate the plurality of settings for the second capacitive element based on the calibration of the voltage controlled oscillator.

24. The apparatus of claim 23, wherein the at least one processor is configured to calibrate the voltage controlled oscillator by changing a capacitance of a capacitor in the voltage controlled oscillator for varying an output signal frequency.

25. A apparatus for canceling electromagnetic (EM) coupling, comprising:
means for generating a plurality of settings for a negative transconductance circuit coupled to a ring structure, wherein the ring structure at least partially surrounds an EM circuit; and
means for tuning the negative transconductance circuit to one of the plurality of settings for the negative transconductance circuit to cancel an EM coupling to the EM circuit at a frequency.

26. The apparatus of claim 25, further comprising:
means for generating a plurality of settings for a capacitive element coupled to the ring structure; and
means for tuning the capacitive element to one of the plurality of settings for the capacitive element to cancel the EM coupling to the EM circuit at the frequency.

27. The apparatus of claim 26, further comprising:
means for generating the plurality of settings for a second negative transconductance circuit coupled to a second ring structure, wherein the second ring structure at least partially surrounds the EM circuit; and
means for tuning the second negative transconductance circuit to one of the plurality of settings for the second negative transconductance circuit to cancel a second EM coupling to the EM circuit at a second frequency.

28. The apparatus of claim 27, further comprising:
means for generating a plurality of settings for a second capacitive element coupled to the second ring structure; and means for tuning the second capacitive element to one of the plurality of settings for the second capacitive element to cancel the second EM coupling to the EM circuit at the second frequency.

29. The apparatus of claim 28, further comprising:

means for calibrating a voltage controlled oscillator, wherein the plurality of settings for the negative transconductance circuit or the plurality of settings for the capacitive element is generated based on a result of calibrating the voltage controlled oscillator.

30. The apparatus of claim 28, further comprising:

means for calibrating a voltage controlled oscillator, wherein the plurality of settings for the second negative transconductance circuit or the plurality of settings for the second capacitive element is generated based on a result of calibrating of the voltage controlled oscillator.

* * * * *